(12) United States Patent
Iwasa et al.

(10) Patent No.: US 7,476,434 B2
(45) Date of Patent: *Jan. 13, 2009

(54) LAMINATE FOR FLEXIBLE PRINTED WIRING BOARD

(75) Inventors: Tsuyoshi Iwasa, Ichihara (JP); Atsushi Funaki, Ichihara (JP); Yoshiaki Higuchi, Ichihara (JP)

(73) Assignee: Asahi Glass Company, Limited, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/764,405

(22) Filed: Jun. 18, 2007

(65) Prior Publication Data

US 2008/0107866 A1 May 8, 2008

Related U.S. Application Data

(63) Continuation of application No. PCT/JP2005/022494, filed on Dec. 7, 2005.

(30) Foreign Application Priority Data

Dec. 20, 2004 (JP) ............................. 2004-367710

(51) Int. Cl.
*B32B 15/082* (2006.01)
*B32B 15/20* (2006.01)
*B32B 27/30* (2006.01)

(52) U.S. Cl. .................. 428/141; 428/335; 428/336; 428/421; 428/422; 428/473.5

(58) Field of Classification Search .................. None
See application file for complete search history.

(56) References Cited

U.S. PATENT DOCUMENTS 5,736,610 A 4/1998 Nishi et al.

| | | |
|---|---|---|
| 6,703,465 B2 | 3/2004 | Funaki et al. |
| 6,916,544 B2 | 7/2005 | Moriyama et al. |
| 6,942,756 B2 | 9/2005 | Suzuki et al. |
| 7,078,470 B2 | 7/2006 | Funaki et al. |
| 7,112,640 B2 | 9/2006 | Funaki et al. |

FOREIGN PATENT DOCUMENTS

| | | |
|---|---|---|
| JP | 63-290735 | 11/1988 |
| JP | 5-55746 | 3/1993 |
| JP | 7-173446 | 7/1995 |
| JP | 2003-049387 | 2/2003 |
| JP | 2004-1510 | 1/2004 |
| JP | 2004-128361 | 4/2004 |

OTHER PUBLICATIONS

U.S. Appl. No. 11/760,809, filed Jun. 11, 2007, Iwasa, et al.

*Primary Examiner*—Ramsey Zacharia
(74) *Attorney, Agent, or Firm*—Oblon, Spivak, McClelland, Maier & Neustadt, P.C.

(57) ABSTRACT

To provide a laminate for a flexible printed wiring board excellent in signal response in the high frequency region. A laminate for a flexible printed wiring board having a three-layer laminated structure where a reinforcing layer (A), an electrical insulator layer (B) and an electrical conductor layer (C) are laminated in this order, wherein the electrical insulator layer (B) is made of a fluorocopolymer comprising repeating units (a) based on tetrafluoroethylene and/or chlorotrifluoroethylene, repeating units (b) based on a fluoromonomer excluding tetrafluoroethylene and chlorotrifluoroethylene, and repeating units (c) based on a monomer having an acid anhydride residue and the electrical conductor layer (C) has a surface roughness of at most 10 μm on the side being in contact with the electrical insulator layer (B). The laminate for a flexible printed wiring board is excellent in signal response in the high frequency region and excellent in flex resistance.

9 Claims, 1 Drawing Sheet

LAMINATE FOR FLEXIBLE PRINTED WIRING BOARD

TECHNICAL FIELD

The present invention relates to a laminate for a flexible printed wiring board.

BACKGROUND ART

In signal transmission in a high frequency region, it is usually desired to improve the transmission rate and to reduce noises, and studies are being made with respect to the board materials for flexible printed wiring boards, the wiring techniques, the circuit configurations, etc.

Heretofore, in a flexible printed wiring board made of a laminate having an electrical conductor layer and an electrical insulator layer, a polyimide resin excellent in heat resistance has been used as the electrical insulator layer. As a process for producing a laminate comprising a polyimide resin layer and an electrical conductor layer, the following three methods are employed. (1) A method wherein a polyimide resin film and a metal foil such as a copper foil are bonded via an adhesive layer, (2) a method wherein a metal layer is formed on a polyimide resin film by a method such as vapor deposition and/or metal plating, and (3) a method wherein a metal foil is coated with a polyimide resin precursor, then a polyimide resin is formed from the precursor by heat treatment, etc. to form a polyimide resin layer on the metal foil. However, laminates obtained by these methods had no adequate adhesion between the polyimide resin layer and the electrical conductor layer and thus sometimes led to operation failure of the circuit (e.g. JP-A-2004-1510).

For application to a high frequency region, a flexible printed wiring board employing a fluororesin excellent in a low dielectric property as the electrical insulator layer, has been proposed. However, as the fluororesin is poor in the adhesive property, it is necessary to use a heat resistant resin such as a polyimide resin to bond the fluororesin layer to the electrical conductive layer, whereby the low dielectric property of the fluororesin can not be adequately utilized (e.g. JP-A-2004-128361).

The adhesion between the electrical insulator layer and the electrical conductor layer, may be improved by forming irregularities of about 3 μm on the surface of the electrical conductor layer on the side being in contact with the electrical insulator layer, but due to a skin effect in a high frequency region, there will be a deviation in the signal arrival time between the surface having such irregularities (hereinafter referred to also as a roughened surface) and a non-roughened surface. Therefore, such irregularities are required to be profiled as low as possible (e.g. JP-A-5-55746). Here, the skin effect is a phenomenon such that a high frequency electrical current will flow only in the vicinity of the surface of the electrical conductor layer. For example, the electric current will flow only within a range of 2.3 μm in depth from the surface with 1 GHz or within a range of 0.7 μm in depth from the surface with 10 GHz.

Accordingly, it is desired to develop a flexible printed wiring board excellent in signal response in a high frequency region.

DISCLOSURE OF THE INVENTION

Object to be Accomplished by the Invention

It is an object of the present invention to provide a laminate for a flexible printed wiring board having a fluororesin layer, which is excellent in adhesion between the electrical conductor layer and the reinforcing layer, excellent in signal response in a high frequency region and excellent also in flexing resistance.

Means to Accomplish the Object

The present invention provides a laminate for a flexible printed wiring board having a three-layer laminated structure where a reinforcing layer (A), an electrical insulator layer (B) and an electrical conductor layer (C) are laminated in this order, wherein the electrical insulator layer (B) is made of a fluorocopolymer comprising repeating units (a) based on tetrafluoroethylene and/or chlorotrifluoroethylene, repeating units (b) based on a fluoromonomer excluding tetrafluoroethylene and chlorotrifluoroethylene, and repeating units (c) based on a monomer having an acid anhydride residue and a polymerizable unsaturated bond in amounts of (a) being from 50 to 99.89 mol %, (b) being from 0.1 to 49.99 mol % and (c) being from 0.01 to 5 mol %, based on ((a)+(b)+(c)) and the electrical conductor layer (c) has a surface roughness of at most 10 μm on the side being in contact with the electrical insulator layer (B).

EFFECTS OF THE INVENTION

The laminate for a flexible printed wiring board of the present invention is excellent in adhesion between the electrical insulator layer (B) made of a fluorocopolymer and the electrical conductor layer (C) with the irregularities on the surface being low-profiled, and excellent in adhesion between the electrical insulator layer (B) and the reinforcing layer (A). The laminate for a flexible printed wiring board of the present invention is excellent in flexing resistance. Further, it is excellent also in the low dielectric constant and low dielectric loss tangent, and thus is excellent in signal response to high frequency signals. It is excellent in electrical properties and particularly excellent in the stability of the operation in a high frequency region.

MEANINGS OF SYMBOLS

Figure 1:
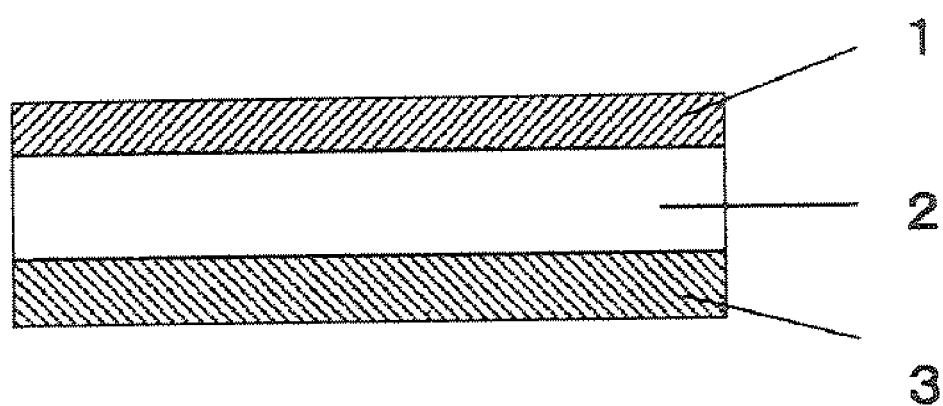
FIG. 1 is a cross sectional view illustrating an embodiment of the laminate for a flexible printed wiring board of the present invention.

1: Electrical conductor layer (C)
2: Electrical insulator layer (B) made of a fluorocopolymer
3: Reinforcing layer (A)

BEST MODE FOR CARRYING OUT THE INVENTION

The fluorocopolymer in the present invention comprises repeating units (a) based on tetrafluoroethylene (hereinafter referred to as TFE) and/or chlorotrifluoroethylene (hereinafter referred to as CTFE), repeating units (b) based on a fluoromonomer excluding TFE and CTFE, and repeating units (c) based on a monomer having an acid anhydride residue and a polymerizable unsaturated bond.

The fluoromonomer in the present invention may, for example, be a fluoroolefin such as vinyl fluoride, vinylidene fluoride (hereinafter referred to as VdF), trifluoroethylene or hexafluoropropylene (hereinafter referred to as HFP), $CF_2=CFOR^1$ (wherein $R^1$ is a $C_{1-10}$ perfluoroalkyl group which may contain an oxygen atom between carbon atoms), $CF_2=CFOR^2SO_2X^1$ (wherein $R^2$ is a $C_{1-10}$ perfluoroalkylene group which may contain an oxygen atom between carbon atoms, and $X^1$ is a halogen atom or a hydroxyl group), $CF_2=CFOR^3CO_2X^2$ (wherein $R^3$ is a $C_{1-10}$ perfluoroalkyl group which may contain an oxygen atom between carbon atoms, and $X^2$ is a hydrogen atom or an alkyl group having at most 3 carbon atoms), $CF_2=CF(CF_2)_pOCF=CF_2$ (wherein p is 1 or 2), $CH_2=CX^3(CF_2)_qX^4$ (wherein $X^3$ is a hydrogen atom or a fluorine atom, q is an integer of from 2 to 10, and $X^4$ is a hydrogen atom or a fluorine atom) or a perfluoro(2-methylene-4-methyl-1,3-dioxolane).

Preferably, it is at least one member selected from the group consisting of VdF, HFP, $CF_2=CFOR^1$ and $CH_2=CX^3(CF_2)_qX^4$, more preferably $CF_2=CFOR^1$ or $CH_2=CX^3(CF_2)_qX^4$.

$CF_2=CFOR^1$ may, for example, be $CF_2=CFOCF_2CF_3$, $CF_2=CFOCF_2CF_2CF_3$, $CF_2=CFOCF_2CF_2CF_2CF_3$ or $CF_2=CFO(CF_2)_8F$. It is preferably $CF_2=CFOCF_2CF_2CF_3$.

$CH_2=CX^3(CF_2)_qX^4$ may, for example, be $CH_2=CH(CF_2)_2F$, $CH_2=CH(CF_2)_3F$, $CH_2=CH(CF_2)_4F$, $CH_2=CF(CF_2)_3H$ or $CH_2=CF(CF_2)_4H$. It is preferably $CH_2=CH(CF_2)_4F$ or $CH_2=CH(CF_2)_2F$.

The monomer (hereinafter referred to also as the AM monomer) having an acid anhydride residue and a polymerizable unsaturated bond in the present invention, may, for example, be itaconic anhydride (hereinafter referred to as IAH), citraconic anhydride (hereinafter referred to as CAH), 5-norbornene-2,3-dicarboxylic anhydride (hereinafter referred to as NAH) or maleic anhydride. It is preferably at least one member selected from the group consisting of IAH, CAH and NAH, more preferably IAH or CAH.

It is more preferred to employ at least one member selected from the group consisting of IAH, CAH and NAH, whereby a fluorocopolymer having an acid anhydride residue can easily be produced without using a special polymerization method required when maleic anhydride is employed (JP-A-11-193312).

In the fluorocopolymer in the present invention, units (a) are from 50 to 99.89 mol %, units (b) are from 0.1 to 49.99 mol %, and units (c) are from 0.01 to 5 mol %, based on ((a)+(b)+(c)). Preferably, repeating units (a) are from 50 to 99.4 mol %, repeating units (b) are from 0.5 to 49.9 mol %, and repeating units (c) are from 0.1 to 3 mol %. More preferably, repeating units (a) are from 50 to 98.9 mol %, repeating units (b) are from 1 to 49.9 mol %, and repeating units (c) are from 0.1 to 2 mol %. When the contents of repeating units (a), (b) and (c) are within such ranges, the electrical insulator layer (B) will be excellent in the heat resistance and chemical resistance. Further, when the content of repeating units (b) is within this range, the fluorocopolymer will be excellent in the moldability and excellent in mechanical properties such as stress cracking resistance. When the content of repeating units (c) is within this range, the electrical insulator layer (B) will be excellent in adhesion with the electrical conductor layer (C) and the reinforcing layer (A).

Further, the fluorocopolymer in the present invention may contain repeating units based on a dicarboxylic acid such as itaconic acid, citraconic acid, 5-norbornene-2,3-dicarboxylic acid or maleic acid, obtainable by hydrolysis of the AM monomer. In a case where repeating units based on such a dicarboxylic acid are contained, the content of the above repeating units (c) represents the total amount of repeating units based on the AM monomer and the repeating units based on the dicarboxylic acid.

In the fluorocopolymer of the present invention, ((a)+(b)+(c)) based on the entire repeating units, is preferably at least 60 mol %, more preferably at least 65 mol %, most preferably at least 68 mol %.

The fluorocopolymer in the present invention preferably contains, in addition to repeating units (a), (b) and (c), repeating units (d) based on a non-fluorinated monomer excluding the AM monomer.

The non-fluorinated monomer may, for example, be an olefin having at most 3 carbon atoms, such as ethylene (hereinafter referred to as E) or propylene (hereinafter referred to as P), a vinylester such as vinyl acetate (hereinafter referred to as VOA), or a vinylether such as ethyl vinyl ether or cyclohexyl vinyl ether. It is preferably E, P or VOA, more preferably E.

In a case where repeating units (d) are contained, their content is such that the molar ratio of ((a)+(b)+(c))/(d) is preferably from 100/5 to 100/90, more preferably from 100/5 to 100/80, most preferably from 100/10 to 100/66.

Preferred specific examples of the fluorocopolymer in the present invention include a TFE/$CF_2=CFOCF_2CF_2CF_3$/IAH copolymer, a TFE/$CF_2=CFOCF_2CF_2CF_3$/CAH copolymer, a TFE/HFP/IAH copolymer, a TFE/HFP/CAH copolymer, a TFE/VdF/IAH copolymer, a TFE/VdF/CAH copolymer, a TFE/$CH_2=CH(CF_2)_4F$/IAH/E copolymer, a TFE/$CH_2=CH(CF_2)_4F$/CAH/ethylene copolymer, a TFE/$CH_2=CH(CF_2)_2F$/IAH/E copolymer, a TFE/$CH_2=CH(CF_2)_2F$/CAH/E copolymer, a CTFE/$CH_2=CH(CF_2)_4F$/IAH/E copolymer, a CTFE/$CH_2=CH(CF_2)_4F$/CAH/E copolymer, a CTFE/$CH_2=CH(CF_2)_2F$/IAH/E copolymer and a CTFE/$CH_2=CH(CF_2)_2F$/CAH/E copolymer.

It is also preferred that the fluorocopolymer in the present invention has functional groups such as ester groups, carbonate groups, hydroxyl groups, carboxyl groups, carbonyl fluoride groups or acid anhydride groups, as polymer terminal groups, whereby adhesion between the electrical insulator layer (B) and the electrical conductor layer (C) will be improved. Such polymer terminal groups are preferably introduced by suitably selecting a radical polymerization initiator, a chain transfer agent, etc. to be used for the production of the fluorocopolymer.

The volume flow rate (hereinafter referred to as value Q) of the fluorocopolymer in the present invention is preferably from 0.1 to 1,000 mm$^3$/sec. The value Q is an index showing the melt flowability of the fluorocopolymer and will be an index for the molecular weight. The larger the value Q, the smaller the molecular weight, and the smaller the value Q, the higher the molecular weight. The value Q in the present invention is the extrusion rate of the fluorocopolymer when it is extruded into an orifice with a diameter of 2.1 mm and a length of 8 mm under a load of 7 kg at a temperature higher by 50° C. than the melting point of the fluorocopolymer by means of a flow tester manufactured by, Shimadzu Corporation. If the value Q is too small, the forming property by extrusion will be poor, and if it is too large, the mechanical strength of the fluorocopolymer will be low. The value Q of the fluorocopolymer is more preferably from 5 to 500 mm$^3$/sec, most preferably from 10 to 200 mm$^3$/sec.

The production method for the fluorocopolymer of the present invention is not particularly limited, and a polymerization method employing a radical polymerization initiator is used. The polymerization method may be bulk polymerization, solution polymerization using an organic solvent such as a fluorinated hydrocarbon, a chlorinated hydrocarbon, a fluorochlorinated hydrocarbon, an alcohol or a hydrocarbon, suspension polymerization using an aqueous medium, and if necessary, a suitable organic solvent, or emulsion polymerization using an aqueous medium and an emulsifier, and particularly preferred is solution polymerization.

The radical polymerization initiator may, for example, be a radical polymerization initiator having a temperature for a half life of 10 hours being preferably from 0° C. to 100° C., more preferably from 20 to 90° C. Specific examples include an azo dye such as azo bisisobutyronitrile; a non-fluorinated diacyl peroxide such as isobutyryl peroxide, octanoyl peroxide, benzoyl peroxide or lauroyl peroxide; a peroxy dicarbonate such as diisopropyl peroxycarbonate; a peroxy ester such as tert-butyl peroxypivalate, tert-butyl peroxyisobutyrate or tert-butyl peroxyacetate; a fluorinated diacyl peroxide such as a compound represented by $(Z(CF_2)_rCOO)_2$ (wherein Z is a hydrogen atom, a fluorine atom, or a chlorine atom, and r is an integer of from 1 to 10); and an inorganic peroxide such as potassium persulfate, sodium persulfate, or ammonium persulfate.

It is also preferred to use a chain transfer agent in order to control the value Q of the fluorocopolymer in the present invention. Such a chain transfer agent may, for example, be an alcohol such as methanol or ethanol, a chlorofluorohydrocarbon such as 1,3-dichloro-1,1,2,2,3-pentafluoropropane or 1,1-dichloro-1-fluoroethane, or a hydrocarbon such as pentane, hexane or cyclohexane. Further, it is preferred to employ a chain transfer agent having a functional group such as an ester group, a carbonate group, a hydroxyl group, a carboxyl group or a carbonyl fluoride group, whereby adhesive polymer terminal groups will be introduced to the fluorocopolymer. Such a chain transfer agent may, for example, be acetic acid, acetic anhydride, methyl acetate, ethylene glycol or propylene glycol.

The polymerization conditions are not particularly limited, and the polymerization temperature is preferably from 0 to 100° C., more preferably from 20 to 90° C. The polymerization pressure is preferably from 0.1 to 10 MPa, more preferably from 0.5 to 3 MPa. The polymerization time is preferably from 1 to 30 hours.

The concentration of the AM monomer in the polymer is preferably from 0.01 to 5%, more preferably from 0.1 to 3%, most preferably from 0.1 to 1%, based on all monomers. If the concentration of the AM monomer is too high, the polymerization rate tends to be low. When it is within the above range, the polymerization rate during the production is proper, and the adhesion of the fluorocopolymer will be good. During the polymerization, as the AM monomer is consumed by polymerization, it is preferred to continuously or intermittently supply the consumed amount into the polymerization tank to maintain the AM monomer concentration to be within this range.

The thickness of the electrical insulator layer (B) is preferably from 5 to 500 μm, more preferably from 10 to 300 μm. If the thickness is too thin, the flexible printed wiring board tends to be deformed or bent, and the circuit wiring tends to be broken. On the other hand, if it is too thick, the laminate will be thick, whereby it tends to be difficult to meet with the requirements for small sizing or weight reduction of instruments. When the thickness is within this range, is the laminate will be excellent in flexibility and it will be possible to meet with the requirements for small sizing and weight reduction of instruments.

In the present invention, it is also preferred that the fluorocopolymer contains an inorganic filler with low dielectric constant and dielectric loss tangent. Such an inorganic filler may, for example, be silica, clay, talc, calcium carbonate, mica, diatomaceous earth, alumina, zinc oxide, titanium oxide, calcium oxide, magnesium oxide, iron oxide, tin oxide, antimony oxide, calcium hydroxide, magnesium hydroxide, aluminum hydroxide, basic magnesium carbonate, magnesium carbonate, zinc carbonate, barium carbonate, dawsonite, hydrotalcite, calcium sulfate, barium sulfate, calcium silicate, montmorillonite, bentonite, activated earth, sepiolite, imogolite, selicite, glass fiber, glass beads, silica balloons, carbon black, carbon nanotube, carbon nanohorn, graphite, carbon fiber, glass balloons, carbon balloons, wood powder or zinc borate. Such inorganic fillers may be used alone or in combination as a mixture of two or more of them.

The content of the inorganic filler is preferably from 0.1 to 100 masse, more preferably from 0.1 to 60 mass %, based on the fluorocopolymer. Further, such an inorganic filler is preferably porous, whereby the dielectric constant and dielectric loss tangent of the electrical insulator layer (B) can be made lower. Further, the inorganic filler is preferably subjected to surface treatment with a surface treating agent such as a silane coupling agent or a titanate coupling agent in order to improve the dispersibility in the fluorocopolymer.

The electrical conductor layer (C) in the present invention is preferably made of an electrically low resistive and electrically conductive metal foil, more preferably made of a metal foil of copper, silver, gold or aluminum. Such metals may be used alone or in combination of two or more of them. As a method of using two or more metals in combination, it is preferred to apply metal plating to a metal foil. Particularly preferred is a copper foil having gold plating applied thereon. The electrical conductor layer (C) is more preferably made of a metal foil of copper, silver, gold or aluminum, or a copper foil having gold plating applied thereon.

The thickness of the electrical conductor layer (C) is preferably from 0.1 to 100 μm, more preferably from 1 to 50 μm, most preferably from 1 to 30 μm.

The electrical conductor layer (C) has a surface roughness (hereinafter referred to also as Rz) of at most 10 μm on the side being in contact with the electrical insulator layer (B). Hereinafter, the side of the surface having irregularities will be referred to as a roughened surface. In order to reduce the skin effect is during the use in a high frequency region, Rz of the roughened surface of the electrical conductive layer (C) is preferably from 0.1 to 5 μm, more preferably from 0.1 to 3 μm, most preferably from 0.1 to 2 μm. It is also preferred that the electrical conductor layer (C) has an oxide coating film of e.g. a chromate having an anti-corrosive property on the surface on the side opposite to the roughened surface.

The reinforcing layer (A) in the present invention is preferably made of a polyimide resin, a polyether ether ketone resin, a polyphenylene oxide resin, a LCP resin (referred to also as a liquid crystal polymer), a PTFE (referred to also as polytetrafluoroethylene) porous material, a polyester resin, a polyamide resin, a fluororesin, an aramid fiber woven fabric, an aramid fiber non-woven fabric, an aramid paper, an aramid film, a glass fiber woven fabric, a cotton woven fabric, paper or the like. It is more preferably at least one member selected from the group consisting of a polyimide resin, a polyether ether ketone resin, a polyphenylene oxide resin, a LCP resin, an aramid fiber and a PTFE porous material. It is also preferred to apply surface treatment to the surface of the reinforcing layer (A) to be in contact with the electrical insulator layer (B) in order to improve the adhesion with the electrical insulator layer (B). As such a surface treatment method, corona discharge treatment, low temperature plasma treatment, chemical etching or treatment with a silane coupling agent may, for example, be mentioned.

The laminate for a flexible printed wiring board of the present invention has a three-layer laminated structure wherein the reinforcing layer (A), the electrical insulator layer (B) and the electrical conductor layer (C) are laminated in this order. FIG. 1 shows a cross sectional view of an embodiment of the laminate for a flexible printed wiring board of the present invention. The laminate for a flexible printed wiring board is a laminate comprising an electrical conductor layer (C)1, an electrical insulator layer (B)2 and a reinforcing layer (A)3. Such a laminate can be used as a single-sided flexible printed wiring board.

Further, the laminate for a flexible printed wiring board of the present invention may, for example, be a laminate for a double-side flexible printed wiring board composed of five layers of electrical conductor layer (C)/electrical insulator layer (B)/reinforcing layer (A)/electrical insulator layer (B)/electrical conductor layer (C) obtained by laminating an electrical insulator layer (B) and an electrical conductor layer (C) further on another side of the above-mentioned single-sided flexible printed wiring board, or a laminate for a multilayer flexible printed wiring board obtained by laminating electrical conductor layer (C)/electrical insulator layer (B) in multiple layers on the above-mentioned single-sided flexible printed wiring board or by laminating electrical conductor layer (C)/electrical insulator layer (B) and electrical insulator layer (B)/electrical conductor layer (C) in multiple layers on each side of the above-mentioned double-side flexible printed wiring board. Such a laminate is useful by itself as a flexible printed wiring board.

As the method for producing the laminate for a flexible printed wiring board of the present invention, various press forming methods, extrusion methods, laminating methods or coating methods may be mentioned. Further, there may, for example, be mentioned a method wherein the fluorocopolymer is formed into a film of the fluorocopolymer by a method such as an extrusion method or a press forming method, and then, the obtained film is laminated with a reinforcing layer (A) and a metal foil, or a method wherein a film of the fluorocopolymer is extrusion-laminated on a metal foil, and then laminated with a reinforcing layer (A), or a method wherein the fluorocopolymer film is extrusion-laminated on a reinforcing layer (A), and then laminated with a metal foil. Particularly preferred is the extrusion laminating method, since it is excellent in productivity as the production process is short.

In a case where a press forming method is employed for producing the laminate for a flexible printed wiring board of the present invention, the temperature as a pressing condition for the electrical insulator layer (B) and the electrical conductor layer (C) is preferably from 200 to 420° C., more preferably from 220 to 400° C. The pressure is preferably from 0.3 to 30 MPa, more preferably from 0.5 to 20 MPa, most preferably from 1 to 10 MPa. The time is preferably from 3 to 240 minutes, more preferably from 5 to 120 minutes, most preferably from 10 to 80 minutes. As the pressing plate to be used for the press forming, a stainless steel plate is preferred.

The method for forming a wiring circuit on the surface of the laminate for a flexible printed wiring board of the present invention, may, for example, be a method of etching the electrical conductor layer (C) on the surface of the laminate, or a method of treating the surface with plating.

EXAMPLES

Now, the present invention will be described in detail with reference to Examples, but it should be understood that the present invention is by no means restricted thereto. Examples 1 to 3 are Working Examples of the present invention, and Example 4 is a Comparative Example. Here, the copolymer composition of the fluorocopolymer, the dielectric constant and dielectric loss tangent, the adhesion, and the flexing resistance were measured by the following methods.

Copolymer Composition of Fluorocopolymer

Measured by means of NMR of melt, the fluorine content analysis and the infrared absorption spectrum analysis. Here, the content of repeating units based on the AM monomer was obtained by the following method.

Content of Repeating Units Based on IAH or CAH

A fluorocopolymer was press-formed to obtain a film of 200 μm. In the infrared absorption spectrum, the absorption peak of the stretching vibration of C=O in the repeating units based on IAH or CAH in the fluorocopolymer appears at 1,870 cm$^{-1}$ in each case. The absorbance at the absorption peak is measured, and the content M (mol %) of the repeating units based on IAH or CAH was determined by means of the relational expression of M=aL, where L is the absorbance at 1,870 cm$^{-1}$, and a is a coefficient. As a, a=0.87 was employed, which was determined by using IAH as the model compound.

Dielectric Constant and Dielectric Loss Tangent

A film of a fluorocopolymer having a thickness of 3 mm was cut into a size of 200 mm×120 mm to obtain a test film. A conductive paste was applied on each side of the test film to form wiring, whereupon the dielectric constant and dielectric loss tangent at 1 MHz were measured.

Volume Flow Rate (Value Q)

By means of a flow tester manufactured by Shimadzu Corporation, the extrusion rate of the fluorocopolymer when it was extruded into an orifice with a diameter of 2.1 mm and a length of 8 mm under a load of 7 kg at a temperature higher by 50° C. than the melting point of the fluorocopolymer, was measured.

Adhesion

A laminated film was cut to obtain a test specimen having a length of 150 mm and width of 10 mm. From an end in the longitudinal direction of the test specimen to a position at 50 mm from the end, the electrical insulator layer (B) and the electrical conductor layer (C) were peeled. Then, with that position at the center, they were peeled by means of a tensile tester at a peeling angle of 180° and a tensile speed of 50 mm/min, whereby the maximum load was taken as the peel strength (N/10 mm) The larger the peel strength, the better the adhesion.

Flexing Resistance

In accordance with ASTM-D2176, MIT bending test was carried out by means of a folding endurance tester (BE-202 manufactured by TESTER SANGYO CO., LTD., dead weight system) The load forward R was 0.38 mm, and a load of 1,000 g was used. The more the number of MIT bending times, the better the flexing resistance.

Example 1

A polymerization tank having an internal capacity of 94 L and equipped with a stirrer, was deaerated, and 71.3 kg of 1-hydrotridecafluorohexane (hereinafter referred to as HTH), 20.4 kg of 1,3-dichloro-1,1,2,2,3-pentafluoropropane (AK225cb manufactured by Asahi Glass Company, Limited, hereinafter referred to as AK225cb), 562 g of CH$_2$=CH(CF$_2$)$_2$F and 4.45 g of IAH were charged. The interior of the polymerization tank was heated to 66° C., and an initial monomer mixed gas of TFE/E in a molar ratio of 89/11 was introduced to raise the pressure to 1.5 MPa/G. As a polymerization initiator, 1 L of a 0.7% HTH solution of tert-butyl peroxypivalate was charged to initiate the polymerization. In order to maintain the pressure to be constant during the polymerization, the monomer mixed gas of TFE/E in a molar ratio of 59.5/40.5 was continuously charged. Further, $CH_2=CH(CF_2)_2F$ in an amount corresponding to 3.3 mol % and IAH in an amount corresponding to 0.8 mol %, based on the total molar amount of TFE and E charged during the polymerization, were continuously charged. After 9.9 hours from the initiation of the polymerization and when 7.28 kg of the monomer mixture gas was charged, the internal temperature of the polymerization tank was lowered to room temperature, and the gas was purged to normal pressure.

The obtained slurry of fluorocopolymer 1 was put into a granulation tank of 200 L charged with 77 kg of water, and then heated to 105° C. with stirring and granulated while the solvent was distilled off. The obtained granulated product was dried at 150° C. for 15 hours to obtain 6.9 kg of a granulated product 1 of the fluorocopolymer 1.

The copolymer composition of the fluorocopolymer 1 was found to be such that the molar ratio of repeating units based on TFE/repeating units based on $CH_2=CH(CF_2)_2F$/repeating units based on IAH/repeating units based on E was 93.5/5.7/0.8/62.9. The melting point was 230° C., and the value Q was 48 mm³/sec.

The fluorocopolymer 1 was formed by extrusion to obtain a film 1 having a thickness of 25 μm. The dielectric constant of the fluorocopolymer 1 was 2.7, and the dielectric loss tangent was 0.005.

A polyimide resin (UPILEX VT, manufactured by UBE INDUSTRIES, LTD.) having a thickness of 25 μm and a width of 380 mm as the reinforcing layer (A), a rolled copper foil (RCF-T4X-12, manufactured by FUKUDA METAL FOIL POWDER CO., LTD.) having a thickness of 12 μm, a width of 380 mm and Rz of 1.0 μm as the electrical conductor layer (C) and the film 1 as the electrical insulator layer (B) were laminated in the order of (A)/(B)/(C) and subjected to vacuum pressing at a temperature of 320° C. under a pressure of 3.7 MPa for 10 minutes to obtain a three layer laminated film 1 composed of layer of polyimide resin/layer of fluorocopolymer 1/layer of rolled copper foil and having a thickness of 62 μm. In the laminated film 1, the peel strength between the layer of the fluorocopolymer 1 and the layer of the roll copper foil was 28 N/10 mm, and the peel strength between the layer of the polyimide resin and the layer of the fluorocopolymer 1 was 25 N/10 mm, thus showing an adequate adhesive force. Further, the number of MIT bending times of the laminated film 1 was 3,000 times.

Example 2

The polymerization tank used in Example 1 was deaerated, and 902 kg of AK225cb, 0.216 kg of methanol, 31.6 kg of $CF_2=CFOCF_2CF_2CF_3$ and 0.43 kg of IAH were charged. The interior of the polymerization tank was raised to 50° C., and TFE was charged until the pressure became 0.38 MPa. As a polymerization initiator solution, 50 mL of 0.25% AK225cb solution of di(perfluorobutyryl) peroxide was charged to initiate the polymerization. In order to maintain the pressure to be constant during the polymerization, TFE was continuously charged. The above polymerization initiator solution was additionally added as the case requires, and the charging rate of TFE was maintained to be substantially constant. The polymerization initiator solution was charged in a total amount of 120 mL. Further, IAH in an amount corresponding to 1 mol % of TFE continuously charged, was charged. After 6 hours from the initiation of the polymerization and when 7.0 kg of TFE was charged, the interior of the polymerization tank was cooled to room temperature, and unreacted TFE was purged.

The obtained slurry of fluorocopolymer 2 was put into a granulation tank of 200 L charged with 75 kg of water, then heated to 105° C. with stirring and granulated while the solvent was distilled off. The obtained granulated product was dried at 150° C. for 5 hours to obtain 7.5 kg of a granulated product 2 of the fluorocopolymer 2.

The copolymer composition of the fluorocopolymer 2 was such that repeating units based on TFE/repeating units based on $CF_2=CFOCF_2CF_2CF_3$/repeating units based on IAH=97.7/2.0/0.3. The melting point was 292° C., and the value Q was 15 mm³/sec.

The granulated product 2 of the fluorocopolymer 2 was formed by extrusion to obtain a film 2 having a thickness of 25 μm. The dielectric constant of the fluorocopolymer 2 was 2.1, and the dielectric loss tangent was 0.005.

A three layer laminated film 2 composed of layer of polyimide resin/layer of fluorocopolymer 2/layer of rolled copper foil and having a thickness of 62 μm, was obtained in the same manner as in Example 1 except that the film 2 was used as the electrical insulator layer (B). In the laminated film 2, the peel strength between the layer of the fluorocopolymer 2 and the layer of the rolled copper foil was 26 N/10 mm, and the peel strength between the layer of the polyimide resin and the layer of the fluorocopolymer 2 was 24 N/10 mm, thus showing an adequate adhesive force. The number of MIT bending times of the laminated film 2 was 3,500 times.

Example 3

In the same manner as in Example 1 except that a polyether ether ketone (PEEK381G, manufactured by VICTREX) having a thickness of 18 μm and a width of 380 mm was used instead of the polyimide resin as the reinforcing layer (A), a three layer laminated film 3 composed of layer of polyether ether ketone/layer of fluorocopolymer 1/layer of rolled copper foil and having a thickness of 68 μm, was obtained. In the laminated film 3, the peel strength between the layer of the fluorocopolymer 1 and the layer of the rolled copper foil was 28 N/10 mm, and the peel strength between the layer of the polyether ether ketone and the layer of the fluorocopolymer 1 was 21 N/10 mm, thus showing an adequate adhesive force. The number of MIT bending times of the laminated film 3 was 3,300 times.

Example 4

Comparative Example

In a double layer flexible printed board (PKW1018RA, manufactured by Arisawa Manufacturing Co., Ltd.) composed of a layer of the polyimide resin 1 having a thickness of 25 μm and a rolled copper foil having a thickness of 18 μm, the peel strength between the layer of the polyimide resin 1 and the layer of the rolled copper foil was 8 N/10 mm, and thus, the adhesion was inadequate. The number of MIT bending times of the laminated film 4 was 1,000 times. Further, the dielectric constant of the layer of the polyimide resin 1 was 3.6, and the dielectric loss tangent was 0.030.

INDUSTRIAL APPLICABILITY

A flexible printed wiring board obtained from the laminate for a flexible printed wiring board of the present invention is useful as an insulation film for an electronic circuit board. It is suitable for a one-side flexible printed wiring board, a double-side flexible printed wiring board and a multilayered flexible printed wiring board.

Specific applications of a flexible printed wiring board obtained from the laminate for a flexible printed wiring board of the present invention include, for example, cell-phones, mobile instruments, notebook PC, digital cameras, video cameras, memory audio players, HDD and various optical drives, utilizing such characteristics as the low dielectric constant and high flexing resistance. Further, it is suitable also for a substrate for automobile sensors or engine management sensors which require chemical resistance and heat resistance. Further, it is suitable also for a substrate material for ID tags.

The entire disclosure of Japanese Patent Application No. 2004-367710 filed on Dec. 20, 2004 including specification, claims, drawings and summary is incorporated herein by reference in its entirety.

What is claimed is:

1. A laminate for a flexible printed wiring board having a three-layer laminated structure where a reinforcing layer (A), an electrical insulator layer (B) and an electrical conductor layer (C) are laminated in this order, wherein the electrical insulator layer (B) is made of a fluorocopolymer comprising repeating units (a) based on tetrafluoroethylene and/or chlorotrifluoroethylene, repeating units (b) based on a fluoromonomer excluding tetrafluoroethylene and chlorotrifluoroethylene, and repeating units (c) based on a monomer having an acid anhydride residue and a polymerizable unsaturated bond in amounts of (a) being from 50 to 99.89 mol %, (b) being from 0.1 to 49.99 mol % and (c) being from 0.01 to 5 mol %, is based on ((a)+(b)+(c)) and the electrical conductor layer (c) has a surface roughness of at most 10 µm on the side being in contact with the electrical insulator layer (B).

2. The laminate for a flexible printed wiring board according to claim 1, wherein the fluorocopolymer further contains repeating units (d) based on a non-fluorinated monomer excluding the monomer having an acid anhydride residue and a polymerizable unsaturated bond, and the molar ratio of ((a)+(b)+(c))/(d) is from 100/5 to 100/90.

3. The laminate for a flexible printed wiring board according to claim 1, wherein the monomer having an acid anhydride residue and a polymerizable unsaturated bond, is at least one member selected from the group consisting of itaconic anhydride, citraconic anhydride and 5-norbornen-2,3-dicarboxylic anhydride.

4. The laminate for a flexible printed wiring board according to claim 1, wherein the electrical conductor layer (C) is made of a metal foil of copper, silver, gold or aluminum, or a copper foil having gold plating applied thereon.

5. The laminate for a flexible printed wiring board according to claim 1, wherein the reinforcing layer (A) is made of at least one member selected from the group consisting of a polyimide resin, a polyether ether ketone resin, a polyphenylene oxide resin, a LCP resin, an aramide fiber woven fabric, an aramide fiber non-woven fabric, an aramide paper, a glass cloth and a PTFE porous material.

6. The laminate for a flexible printed wiring board according to claim 1, wherein the electrical conductor layer (C) has a thickness of from 1.0 to 20.0 µm.

7. The laminate for a flexible printed wiring board according to claim 1, wherein the reinforcing layer (A) has a thickness of from 1.0 to 30.0 µm.

8. The laminate for a flexible printed wiring board according to claim 1, wherein the electrical conductor layer (C) is made of a copper foil, and the reinforcing layer (A) is made of a polyimide resin.

9. The laminate for a flexible printed wiring board according to claim 1, wherein said surface roughness is from 0.1 to 5 µm.

* * * * *